(12) United States Patent
Fulkerson

(10) Patent No.: US 6,667,520 B1
(45) Date of Patent: Dec. 23, 2003

(54) SEU HARD MAJORITY VOTER FOR TRIPLE REDUNDANCY

(75) Inventor: David E. Fulkerson, Chanhassen, MN (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 10/301,389

(22) Filed: Nov. 21, 2002

(51) Int. Cl.[7] .................. H01L 29/76; H01L 29/94; H01L 31/062; H01L 31/113; H01L 31/119
(52) U.S. Cl. .................. 257/369; 327/103; 327/187; 327/369; 327/378; 327/434; 327/509
(58) Field of Search .......................... 257/369; 327/103, 327/187, 350, 369, 378, 427, 434, 509

(56) References Cited

U.S. PATENT DOCUMENTS

| | | | | |
|---|---|---|---|---|
| 4,001,605 A | * | 1/1977 | Thomas et al. ............. | 327/355 |
| 5,799,022 A | * | 8/1998 | Williams ..................... | 714/797 |
| 5,802,103 A | * | 9/1998 | Jeong ......................... | 375/220 |
| 6,141,770 A | * | 10/2000 | Fuchs et al. .................. | 714/11 |

* cited by examiner

Primary Examiner—Ngân V. Ngô
(74) Attorney, Agent, or Firm—Schiff Hardin & Waite

(57) ABSTRACT

Majority voting between triple redundant integrated circuits is used in order to provide an SEU hardened output signal. Accordingly, an input signal is processed in a predetermined manner to provide a first signal, the input signal is processed in the same manner to provide a second signal, and the input signal is also processed in the same manner to provide a third signal. A majority vote is taken between the first, second, and third signals by an SEU immune majority voter circuit, and an output signal is provided corresponding to the majority vote.

9 Claims, 2 Drawing Sheets

SEU HARD MAJORITY VOTER FOR TRIPLE REDUNDANCY

TECHNICAL FIELD OF THE INVENTION

The present invention is directed to the hardening of integrated circuits so that such circuits are immune to single event upsets (SEUs).

BACKGROUND OF THE INVENTION

Integrated circuits are frequently used in the presence of radiation such as x-rays, gamma-rays, photons, particles, etc. A radiation strike can deposit charge in silicon and, therefore, can cause upsets in the integrated circuits. The most common upset causes are from such particles as protons, neutrons, and heavy ions. As a result of such radiation, charges can be collected at circuit nodes that send the nodes to unintended opposite voltage states (e.g., from high to low). When this voltage state change happens to a data storage circuit, for example, the data storage nodes change to the wrong data states.

All circuits can tolerate some amount of deposited charge that does not cause a node to change states. However, all circuits also have some deposited charge threshold above which the node state will be changed. This threshold is referred to as the critical charge (i.e., Qcrit) for upset. Such node state changes are defined as radiation induced upsets. When radiation particles, which are particles that are discrete in time and space, cause a data upset, the data upset is referred to as a single event upset (SEU).

Various arrangements have been provided to increase the immunity of integrated circuits from single even upsets. For example, co-pending U.S. application Ser. No. 10/034,808 filed on Dec. 28, 2001 gives several examples of SEU hardening techniques for preventing unintended data state changes in storage elements in response to radiation strikes.

FIG. 1 shows another technique to increase the immunity of integrated circuits from single event upsets. As shown in FIG. 1, an integrated circuit is provided with triple redundancy as indicated by instantiations 10, 12, and 14 of the same integrated circuit. The instantiation 10 of this integrated circuit is coupled to an input A of a majority voter circuit 16, the instantiation 12 of the same integrated circuit is coupled to an input B of the majority voter circuit 16, and the instantiation 14 of the same integrated circuit is coupled to an input C of the majority voter circuit 16.

The majority voter circuit 16 provides an output on an output line 18 based on a majority vote between the inputs A, B, and C. For example, if the inputs A and B are the same but are different from the input C, then the output on the output line 18 is based on the inputs A and B. Alternatively, if the inputs B and C are the same but are different from the input A, then the output on the output line 18 is based on the inputs B and C. However, if the inputs A and C are the same but are different from the input B, then the output on the output line 18 is based on the inputs A and C.

The majority voter circuit 16 comprises a first inverter having a p-channel transistor 20 and an n-channel transistor 22 coupled in series between $V_{DD}$ and ground. The gate of the p-channel transistor 20 and the gate of the n-channel transistor 22 are coupled to the input A, and the junction between the p-channel transistor 20 and the n-channel transistor 22 is coupled to the output line 18.

The majority voter circuit 16 also comprises a second inverter having a p-channel transistor 24 and an n-channel transistor 26 coupled in series between $V_{DD}$ and ground. The gate of the p-channel transistor 24 and the gate of the n-channel transistor 26 are coupled to the input B, and the junction between the p-channel transistor 24 and the n-channel transistor 26 is coupled to the output line 18.

The majority voter circuit 16 further comprises a third inverter having a p-channel transistor 28 and an n-channel transistor 30 coupled in series between $V_{DD}$ and ground. The gate of the p-channel transistor 28 and the gate of the n-channel transistor 30 are coupled to the input C, and the junction between the p-channel transistor 28 and the n-channel transistor 30 is coupled to the output line 18.

Accordingly, radiation may strike the sensitive area of one of the instantiations 10, 12, and 14 of the integrated circuit causing the output of that instantiation to assume an incorrect output state radiation. However, it is not likely that radiation will simultaneously strike the sensitive area of a second of the instantiations 10, 12, and 14 of the integrated circuit causing the output of this second instantiation to assume the same incorrect output state. Because it is not likely that radiation will strike the sensitive areas of two or more of the instantiations 10, 12, and 14 at the same time, the output on the output line 18 will be in the correct state because the majority voter circuit 16 will vote on a majority basis to select the inputs unaffected by the radiation and thus control the output on the output line 18 at the intended output state.

As an example, an SEU event may occur in a sensitive area of the instantiation 10 that causes the input A to transition from a low state to a high state so as to turn on the n-channel transistor 22. However, as long as the sum of the drain currents in the p-channel transistors 24 and 28 is greater than the drain current of the n-channel transistor 22, the output signal on the output line 18 will not change states.

Unfortunately, it is distinctly possible that the drain currents in the p-channel transistors 24 and 28 will not be greater than the drain current of the n-channel transistor 22, particularly under worst case conditions, in which case the circuit of FIG. 1 is not immune to SEU events. Also, even if the total drain current of the p-channel transistors 24 and 28 is larger than the drain current of the drain current of the n-channel transistor 22, the speed of the majority voter circuit 16 of FIG. 1 is adversely affected in a significant way due to the competition between the drain currents in the p-channel transistors 24 and 28 and the n-channel transistor 22. Moreover, if a strong SEU event occurs in one of the transistors 20–30, the affected transistor can turn on so hard that its drain current will overcome the drain currents of the other transistors and produce an erroneous output signal on the output line 18. Thus, the majority voter circuit 16 itself is not SEU hardened.

The present invention is directed to a majority voter circuit that overcomes one or more of these or other problems.

SUMMARY OF THE INVENTION

In accordance with one aspect of the present invention, a hardening system comprises first, second, and third integrated circuit blocks and a majority voter circuit. The first, second, and third integrated circuit blocks have substantially identical circuit arrangements with respect to one another, and each of the first, second, and third integrated circuit blocks comprises an output having a signal thereon. The majority voter circuit comprises four transistors coupled to the output of the first integrated circuit block, four transistors coupled to the output of the second integrated circuit block, and two transistors coupled to the output of the third integrated circuit block. The majority voter circuit provides an output signal substantially equal to the signals on the outputs of the first, second, and third integrated circuit blocks that are in the majority.

In accordance with another aspect of the present invention, a hardening system comprises first, second, and third integrated circuit blocks and a majority voter circuit. The first integrated circuit block has an output A providing a first signal thereon, the second integrated circuit block has an output B providing a second signal thereon, and the third integrated circuit block has an output C providing a third signal thereon. The majority voter circuit is coupled to the outputs A, B, and C and has transistors such that there is always a redundant off transistor to block the drain current of a transistor that is turned on by an SEU event.

In accordance with still another aspect of the present invention, a method of providing an SEU hardened output signal comprises the following: processing an input signal in a manner to provide a first signal; processing the input signal in essentially the same manner to provide a second signal; processing the input signal in essentially the same manner to provide a third signal; determining a majority of the first, second, and third signals by way of an SEU immune majority voter circuit; and, providing an output signal corresponding to the majority.

BRIEF DESCRIPTION OF THE DRAWINGS

These and other features and advantages will become more apparent from a detailed consideration of the invention when taken in conjunction with the drawings in which.

DETAILED DESCRIPTION

Figure 1:
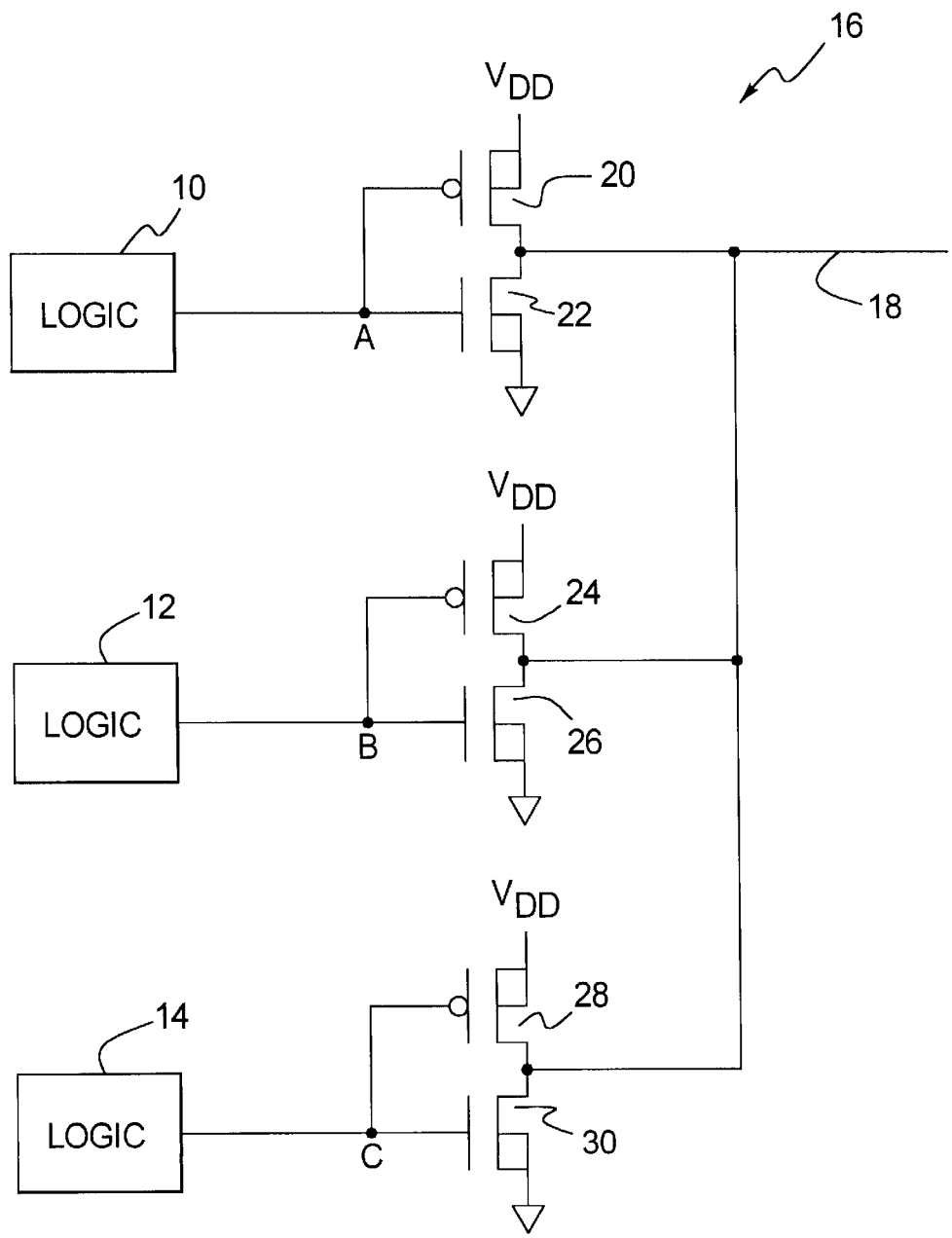
FIG. 1 illustrates a prior art majority voter circuit.
Figure 2:
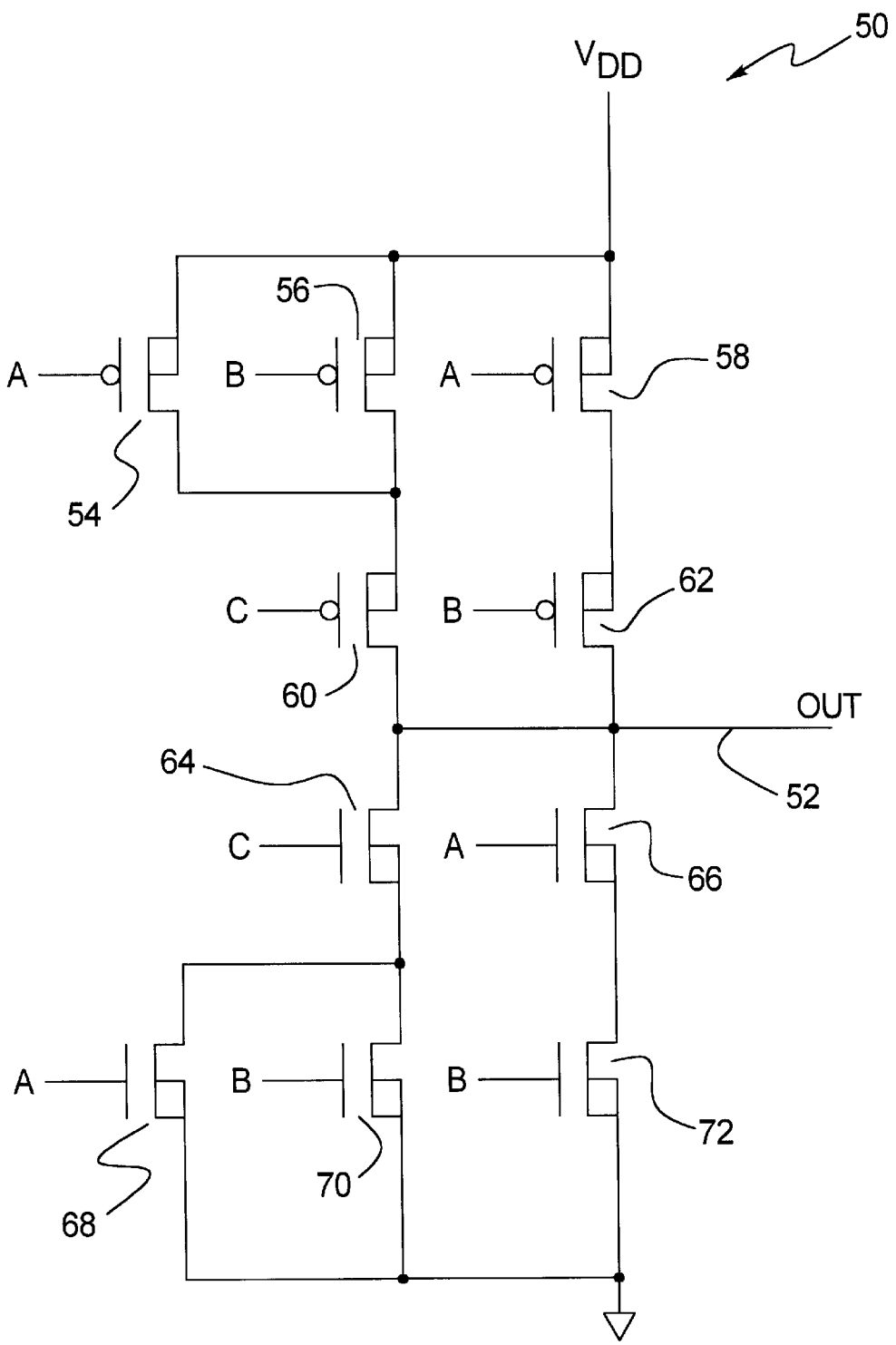
FIG. 2 illustrates a majority voter circuit according to an embodiment of the present invention.

FIG. 2 shows a majority voting technique according to the present invention that increases the immunity of integrated circuits from single even upsets. As in the case of FIG. 1, an integrated circuit is provided with triple redundancy in the form of three instantiations of the same integrated circuit similar to the instantiations 10, 12, and 14 shown in FIG. 1. A first of these instantiations of the integrated circuit is coupled to an input A of a majority voter circuit 50, a second of these instantiations of the same integrated circuit is coupled to an input B of the majority voter circuit 50, and a third of these instantiations of the same integrated circuit is coupled to an input C of the majority voter circuit 50.

The majority voter circuit 50 provides an output on an output line 52 based on a majority vote between the inputs A, B, and C. For example, if the inputs A and B are the same but are different from the input C, then the output on the output line 52 is based on the inputs A and B. Alternatively, if the inputs B and C are the same but are different from the input A, then the output on the output line 52 is based on the inputs B and C. However, if the inputs A and C are the same but are different from the input B, then the output on the output line 52 is based on the inputs A and C.

The majority voter circuit 50 comprises p-channel transistors 54, 56, 58, 60, and 62 and n-channel transistors 64, 66, 68, 70, and 72. The source terminals of the p-channel transistors 54, 56, and 58 are coupled to $V_{DD}$. The drain terminals of the p-channel transistors 54 and 56 are coupled to the source terminal of the p-channel transistor 60, and the drain terminal of the p-channel transistor 58 is coupled to the source terminal of the p-channel transistor 62.

The drain terminals of the p-channel transistors 60 and 62 are coupled to the output line 52 and to the source terminals of the n-channel transistors 64 and 66. The drain terminal of the n-channel transistor 64 is coupled to the source terminals of the n-channel transistors 68 and 70, and the drain terminal of the n-channel transistor 66 is coupled to the source terminal of the n-channel transistor 72. Finally, the drain terminals of the n-channel transistors 68, 70, and 72 are coupled to ground.

The gates of the p-channel transistors 54 and 58 and the gates of the n-channel transistors 66 and 68 are coupled to the input A. The gates of the p-channel transistors 56 and 62 and the gates of the n-channel transistors 70 and 72 are coupled to the input B. The gate of the p-channel transistor 60 and the gate of the n-channel transistor 64 are coupled to the input C.

Accordingly, radiation may strike the sensitive area of one of the instantiations of the integrated circuit coupled to the inputs A, B, and C causing the output of that instantiation to assume an incorrect output state radiation. However, because it is not likely that radiation will also strike the sensitive area of a second of the instantiations at the same time, the output on the output line 52 will be in the correct state because the majority voter circuit 50 will vote on a majority basis to select the two inputs unaffected by the radiation to control the output on the output line 52.

Moreover, it is noted above in connection with FIG. 1 that the drain currents provided by two of the p-channel transistors in two of the invertors of the majority voter circuit 16 may not be greater than the drain current provided by the n-channel transistor in the other of the inverters under worst case conditions. If so, it can be seen that the circuit of FIG. 1 is not immune to SEU events. This circumstance cannot occur in the majority voter circuit 50 because the majority voter circuit 50 ensures that there is always adequate drive current to maintain the output line 52 in the proper state.

It is also noted above in connection with FIG. 1 that, even if the total drain current provided by two of the p-channel transistors in two of the invertors of the majority voter circuit 16 is greater than the drain current provided by the n-channel transistor in the other of the inverters under worst case conditions, the speed of the circuit of FIG. 1 is adversely affected in a significant way due to the competition between the drain currents in the three inverters. However, the speed of the majority voter circuit 50 is not adversely affected in a significant way due to the competition between drain currents.

It is finally noted above that the majority voter circuit of FIG. 1 is somewhat SEU hardened. However, if a strong SEU event occurs in one of the transistors of the majority voter circuit 16, the affected transistor can turn on so hard that its drain current will overcome the drain currents of the other transistors and produce an erroneous output signal on the output line 18. This situation cannot occur in the circuit of FIG. 2 because, in the majority voter circuit 50, there is always a redundant off transistor to block the drain current of a transistor that is turned on by an SEU event. Accordingly, the majority voter circuit 50 is immune to SEU events.

Certain modifications of the present invention will occur to those practicing in the art of the present invention. For example, in the majority voter circuit 50, the transistors 54, 56, 58, 60, and 62 are p-channel transistors and the transistors 64, 66, 68, 70, and 72 are n-channel transistors. Instead, the transistors 54, 56, 58, 60, and 62 may be n-channel transistors and the transistors 64, 66, 68, 70, and 72 may be p-channel transistors.

Also, instantiations 10, 12, and 14 are described above as being instantiations of an integrated circuit. However, instantiations 10, 12, and 14 may instead be instantiations of only portions of an integrated circuit. Thus, an integrated circuit block as used herein means either an entire integrated circuit or a portion of an integrated circuit.

Moreover, the majority voter circuit 50 as shown above has only two transistors coupled to the input C. However, the majority voter circuit 50 may instead have four transistors coupled to the input C as it does in the case of inputs A and B.

Accordingly, the description of the present invention is to be construed as illustrative only and is for the purpose of teaching those skilled in the art the best mode of carrying out the invention. The details may be varied substantially without departing from the spirit of the invention, and the exclusive use of all modifications which are within the scope of the appended claims is reserved.

I claim:

1. A method of providing an SEU hardened output signal comprising:

processing an input signal in a manner to provide a first signal;

processing the input signal in essentially the same manner to provide a second signal;

processing the input signal in essentially the same manner to provide a third signal;

determining a majority of the first, second, and third signals by way of an SEU immune majority voter circuit; and, providing an output signal corresponding to the majority.

2. The method of claim 1 wherein the SEU immune majority voter circuit comprises p-channel transistors and n-channel transistors.

3. The method of claim 1 wherein the SEU immune majority voter circuit consists of first, second, third, fourth, and fifth p-channel transistors and first, second, third, fourth, and fifth n-channel transistors.

4. The method of claim 1 wherein the SEU immune majority voter circuit comprises first, second, third, fourth, and fifth p-channel transistors and first, second, third, fourth, and fifth n-channel transistors.

5. The method of claim 4 wherein the second and fourth p-channel transistors and the fourth and second n-channel transistors are coupled in series between $V_{DD}$ and ground, wherein the third and fifth p-channel transistors and the fifth and third n-channel transistors are coupled in series between $V_{DD}$ and ground, wherein the first and second p-channel transistors are coupled in parallel, wherein the first and second n-channel transistors are coupled in parallel, and wherein the output signal of the majority voter circuit is provided by a junction of the fourth and fifth p-channel transistors and the fourth and fifth n-channel transistors.

6. The method of claim 4 wherein each of the first, second, third, fourth, and fifth p-channel transistors and each of the first, second, third, fourth, and fifth n-channel transistors has a drain, a source, and a gate, wherein the sources of the first, second, and third p-channel transistors are coupled to $V_{DD}$, wherein drains of the first, second, and third n-channel transistors are coupled to ground, wherein the drain of the second p-channel transistor is coupled to the source of the fourth p-channel transistor, wherein the drain of the third p-channel transistor is coupled to the source of the fifth p-channel transistor, wherein the drain of the first p-channel transistor is coupled to the drain of the second p-channel transistor, wherein the drain of the fourth n-channel transistor is coupled to the source of the second n-channel transistor, wherein the drain of the fifth n-channel transistor is coupled to the source of the third n-channel transistor, wherein the source of the first n-channel transistor is coupled to the source of the second n-channel transistor, wherein the drains of the fourth and fifth p-channel transistors and the sources of the fourth and fifth n-channel transistors are coupled together to provide the output signal of the majority voter circuit, wherein the gates of the first and third p-channel transistors and the gates of the first and fifth n-channel transistors are coupled to the output of the first integrated circuit, wherein the gates of the second and fifth p-channel transistors and the gates of the second and third n-channel transistors are coupled to the output of the second integrated circuit, and wherein the gate of the fourth p-channel transistor and the gate of the fourth n-channel transistor are coupled to the output of the third integrated circuit.

7. The method of claim 1 wherein the SEU immune majority voter circuit comprises first, second, third, fourth, fifth, sixth, seventh, eighth, ninth, and tenth transistors.

8. The method of claim 7 wherein the second, fourth, sixth, and ninth transistors are coupled in series between first and second terminals, wherein the third, fifth, seventh, and tenth transistors are coupled in series between the first and second terminals, wherein the first and second transistors are coupled in parallel, herein the eighth and ninth transistors are coupled in parallel, and wherein the output signal of the majority voter circuit is provided by a junction of the fourth, fifth, sixth, and seventh transistors.

9. The method of claim 7 wherein each of the first, second, third, fourth, fifth, sixth, seventh, eighth, ninth, and tenth transistors has an input, an output, and a control, wherein inputs of the first, second, and third transistors are coupled to the first terminal, wherein outputs of the eighth, ninth, and tenth transistors are coupled to the second terminal, wherein the output of the second transistor is coupled to the input of the fourth transistor, wherein the output of the third transistor is coupled to the input of the fifth transistor, wherein the output of the first transistor is coupled to the output of the second transistor, wherein the output of the sixth transistor is coupled to the input of the ninth transistor, wherein the output of the seventh transistor is coupled to the input of the tenth transistor, wherein the input of the eighth transistor is coupled to the input of the ninth transistor, wherein the outputs of the fourth and fifth transistors and the inputs of the sixth and seventh transistors are coupled together to provide the output signal of the majority voter circuit, wherein the controls of the first, third, seventh, and eighth transistors are coupled to the output of the first integrated circuit, wherein the controls of the second, fifth, ninth, and tenth transistors are coupled to the output of the second integrated circuit, and wherein the controls of the fourth and sixth transistors are coupled to the output of the third integrated circuit.

* * * * *

UNITED STATES PATENT AND TRADEMARK OFFICE
CERTIFICATE OF CORRECTION

PATENT NO. : 6,667,520 B1
DATED : December 23, 2003
INVENTOR(S) : David E. Fulkerson It is certified that error appears in the above-identified patent and that said Letters Patent is hereby corrected as shown below:

Column 8,
Line 32, after "parallel," please change "herein" to -- wherein --.

Signed and Sealed this

Twenty-ninth Day of June, 2004

JON W. DUDAS
*Acting Director of the United States Patent and Trademark Office*